(12) United States Patent
Ozturk et al.

(10) Patent No.: US 9,178,531 B1
(45) Date of Patent: Nov. 3, 2015

(54) SERVO GRAY CODE CHECK BITS

(71) Applicant: Seagate Technology LLC, Cupertino, CA (US)

(72) Inventors: Mustafa Can Ozturk, Eden Prairie, MN (US); Puskal Prasad Pokharel, Edina, MN (US); Barmeshwar Vikramaditya, Eden Prairie, MN (US); Thomas C. Zirps, Minneapolis, MN (US)

(73) Assignee: Seagate Technology LLC, Cupertino, CA (US)

( * ) Notice: Subject to any disclaimer, the term of this patent is extended or adjusted under 35 U.S.C. 154(b) by 300 days.

(21) Appl. No.: 13/869,191

(22) Filed: Apr. 24, 2013

(51) Int. Cl.
  *H03M 13/00* (2006.01)
  *H03M 13/05* (2006.01)
  *H03M 13/09* (2006.01)

(52) U.S. Cl.
  CPC .............. *H03M 13/05* (2013.01); *H03M 13/09* (2013.01)

(58) Field of Classification Search
  CPC ................. H03M 2201/122; H03M 2201/128; H03M 2201/844; H03M 13/096
  USPC .......................... 360/77, 77.08; 714/801, 807
  See application file for complete search history.

(56) References Cited

U.S. PATENT DOCUMENTS

| | | | | |
|---|---|---|---|---|
| 4,286,296 A | * | 8/1981 | Cunningham | 360/77.11 |
| 4,311,987 A | | 1/1982 | Taillebois | |
| 4,954,905 A | * | 9/1990 | Wakabashi et al. | 360/77.03 |
| 5,065,263 A | * | 11/1991 | Yoshida et al. | 360/77.03 |
| 5,097,491 A | | 3/1992 | Hall | |
| 5,392,302 A | | 2/1995 | Kemp | |
| 5,418,768 A | | 5/1995 | Senshu | |
| 5,442,498 A | * | 8/1995 | Cheung et al. | 360/77.08 |
| 5,442,499 A | * | 8/1995 | Emori | 360/77.08 |
| 5,568,331 A | * | 10/1996 | Akagi et al. | 360/77.07 |
| 5,852,522 A | | 12/1998 | Lee | |
| 6,226,138 B1 | | 5/2001 | Blaum | |
| 6,775,081 B2 | | 8/2004 | Ottesen | |
| 7,194,500 B2 | | 3/2007 | Clift | |
| 7,436,902 B2 | | 10/2008 | Shen | |
| 7,991,104 B1 | | 8/2011 | Dahan | |
| 8,015,478 B2 | | 9/2011 | Miller | |
| 2004/0160696 A1 | * | 8/2004 | Meyer | 360/77.05 |
| 2006/0126203 A1 | * | 6/2006 | Kisaka | 360/31 |

* cited by examiner

*Primary Examiner* — David Ton
(74) *Attorney, Agent, or Firm* — Cesari & Reed LLP; Kirk A. Cesari; Christian W. Best

(57) ABSTRACT

The disclosure is related to systems and methods for achieving improved servo Gray code error detection and correction. A device may include a circuit configured to read servo data that is encoded using a Gray code encoding scheme to produce servo Gray code, read one or more Check bits associated with the servo Gray code, determine whether a read or write head is positioned over a target data track based on the servo Gray code and the one or more Check bits, and execute a read or write operation when the read or write head is positioned over the target data track.

23 Claims, 6 Drawing Sheets

FIG. 3

| PES | Main Gray code | | | | | Check | | Mini PES |
|---|---|---|---|---|---|---|---|---|
| 0 | .... | 0 | 0 | 0 | 0 | 0 | 0 | 0 |
| 1 | .... | 0 | 0 | 0 | 1 | 0 | 1 | 1 |
| 2 | .... | 0 | 0 | 1 | 1 | 1 | 1 | 2 |
| 3 | .... | 0 | 0 | 1 | 0 | 1 | 0 | 3 |
| 4 | .... | 0 | 1 | 1 | 0 | 0 | 0 | 0 |
| 5 | .... | 0 | 1 | 1 | 1 | 0 | 1 | 1 |
| 6 | .... | 0 | 1 | 0 | 1 | 1 | 1 | 2 |
| 7 | .... | 0 | 1 | 0 | 0 | 1 | 0 | 3 |

Rows 0–3: Check range 1; Rows 4–7: Check range 2

FIG. 4

| PES | Main Gray code | | | | | Check | | | Mini PES |
|---|---|---|---|---|---|---|---|---|---|
| 0 | .... | 0 | 0 | 0 | 0 | 0 | 0 | 0 | 0 |
| 1 | .... | 0 | 0 | 0 | 1 | 0 | 0 | 1 | 1 |
| 2 | .... | 0 | 0 | 1 | 1 | 0 | 1 | 1 | 2 |
| 3 | .... | 0 | 0 | 1 | 0 | 0 | 1 | 0 | 3 |
| 4 | .... | 0 | 1 | 1 | 0 | 1 | 1 | 0 | 4 |
| 5 | .... | 0 | 1 | 1 | 1 | 1 | 1 | 1 | 5 |
| 6 | .... | 0 | 1 | 0 | 1 | 1 | 0 | 1 | 6 |
| 7 | .... | 0 | 1 | 0 | 0 | 1 | 0 | 0 | 7 |
| 8 | .... | 1 | 1 | 0 | 0 | 0 | 0 | 0 | 0 |

Rows 0–7: Check range 1; Row 8...: Check range 2

SERVO GRAY CODE CHECK BITS

BACKGROUND

The present disclosure relates to detecting and correcting errors in servo Gray code.

SUMMARY

In certain embodiments, a device may comprise a circuit configured to read servo data that is encoded using a Gray code encoding scheme to produce servo Gray code, read one or more Check bits associated with the servo Gray code, determine whether a transducer is positioned over a target data track based on the servo Gray code and the one or more Check bits, and manipulate the transducer based on whether the transducer is positioned over the target data track.

In certain embodiments, a method may comprise manipulating a transducer based on servo Gray code and one or more Check bits that indicate whether the transducer is positioned over a target data track.

In certain embodiments, a device may comprise a disc with tracks including servo data, a transducer, and a controller. The controller may be configured to read servo data that is encoded using a Gray code encoding scheme to produce servo Gray code, read one or more Check bits associated with the servo Gray code, the one or more Check bits defining a Check range of a plurality of tracks, each track in the plurality of tracks containing a unique Check bit value within the Check range, determine whether the transducer is positioned over a target data track in response to the servo Gray code and the one or more Check bits, and manipulate the transducer in response to whether the transducer is positioned over the target data track.

BRIEF DESCRIPTION OF THE DRAWINGS

FIG. 3 is a chart illustrating a system for Gray code Check bits, in accordance with certain embodiments of the present disclosure;

FIG. 4 is another chart illustrating a system for Gray code Check bits, in accordance with certain embodiments of the present disclosure;

DETAILED DESCRIPTION

In the following detailed description of embodiments, reference is made to the accompanying drawings which form a part hereof, and in which are shown by way of illustration of specific embodiments. It is to be understood that features of the various described embodiments may be combined, other embodiments may be utilized, and structural changes may be made without departing from the scope of the present disclosure.

Disc drive devices may include a data storage medium, such as a magnetic disc, and a head for reading data from or writing data to the disc. Servo data stored on the disc may be used to properly position the head over a particular area of the disc. Servo data on a disc may be divided into a number of fields, such as a preamble used for timing recovery, an address mark, sector ID to identify the current disc sector, track ID for coarse head positioning, position bursts that may contain fine head position information, and repeatable run out (RRO) fields. Often, one or more fields of servo data, especially track ID and sector ID, are encoded into Gray code (this may also be referred to as a Gray code field), which can minimize a number of bits that change between successive positions. However, errors in the Gray code detection may result in undesirable or sub-optimal performance of the disc drive device.

Figure 1:
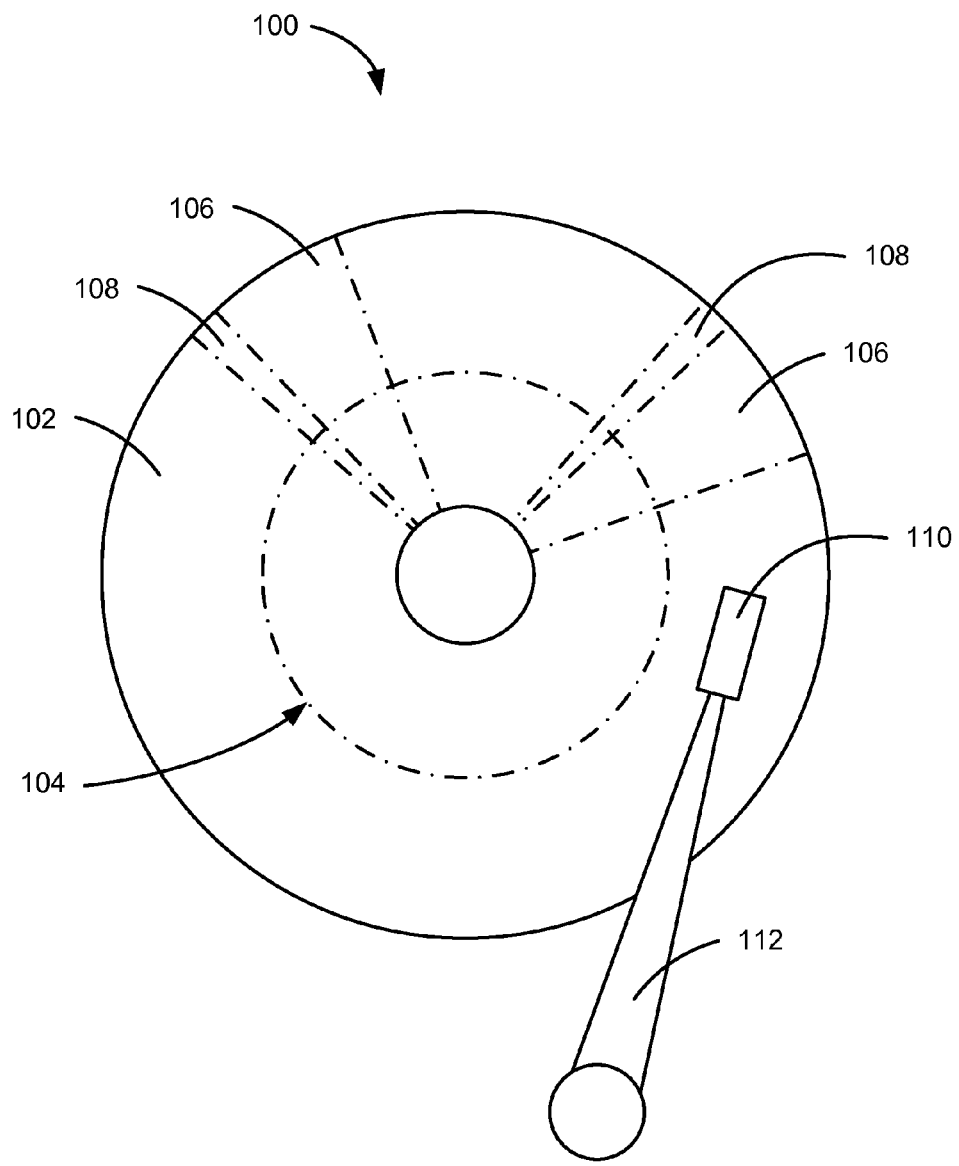
FIG. 1 is a diagram of a data disc and head assembly of a data storage device, in accordance with certain embodiments of the present disclosure.

FIG. 1 is a diagram of an illustrative embodiment of a data disc, such as a magnetic disc or optical disc, and head assembly of a data storage device, generally designated 100. A rotatable data disc 102 can be used as a medium to store digital data. The disc 102 may be divided into a plurality of concentric circular tracks 104 that may store data. The tracks 104 may also be arranged on the disc 102 in a non-concentric pattern, such as in a spiral pattern. The disc 102 may be further divided into a plurality of sectors, such as wedge-shaped sectors 106. Specific data or locations on a disc 102 can be identified with a sector identification ("sector ID") or sector number, and a track identification ("track ID") or track address. This sector ID and track ID can be part of the servo data used to position an arm 112 having a read/write head 110 over the disc 102. The read/write head may be referred to as a head or transducer. A section 108 of each sector 106 may be devoted to store this servo data, while the remainder of the sector 106 may be used to store other data, such as user or system data. During operation, as the disc 102 spins, the head 110 can read the servo data 108 and use such data to move the arm 112 to position the head 110 over specific tracks 104. The data storage device may then read or write data to the disc 102 via the head 110 once a target track is reached.

During a seek operation, the head 110 may traverse the disc 102 at a high speed for positioning over a specific track 104. This can result in the head 110 reading a track ID partly from one track ID and partly from an adjacent track ID. Due to the nature of binary numbering systems, whereby multiple bits may change to advance from one number to the next successive number (e.g. 7=0111, while 8=1000), this may result in reading a track ID that is grossly different from the true track location of the head 110. As a simple example, the head may read the first two bits from track 7 (i.e. 01) and the last two bits from track 8 (i.e. 00), thereby reading a track ID of 4 (i.e. 0100) rather than its true position in the track 7 to 8 region.

For this reason, servo data can be encoded using a Gray code encoding scheme. Binary bit sequences encoded with a Gray code encoding scheme may change by one bit from one number to the next. For example, traditional binary counting may follow a pattern of 0=00; 1=01; 2=10; and 3=11. Meanwhile, Gray code counting may follow a pattern of 0=00; 1=01; 2=11; and 3=10. As shown, only one bit changes between each successive number when counting using Gray code.

By encoding servo data with a Gray code encoding scheme to produce servo Gray code, instances of the head 110 reading a grossly incorrect track ID can be reduced. However, servo Gray code errors may still arise, in the form of erroneous bit values being detected. Such errors can result in improper positioning of the head 110, in marking the sector 106 as an invalid target for write operations, or other detrimental operations for a data storage device.

The sector ID and track ID of the servo data 108 may be encoded with a Gray code encoding scheme individually and stored as individual elements in the servo data sector of a disc 102. Alternatively, the sector ID may be encoded into the track ID, either before or after the track ID is encoded with a Gray code encoding scheme, so that both data elements are included in a single bit sequence. In embodiments where the sector ID and track ID are stored as a single Gray code bit sequence, decoding the data may involve extracting the sector ID data, then decoding the Gray code, or it may involve decoding the Gray code, then separating the sector ID from the track ID. Other variations are also possible. The method and order of encoding and decoding sector ID and track ID Gray code bit sequences may differ based on how a storage system is implemented.

Figure 2:
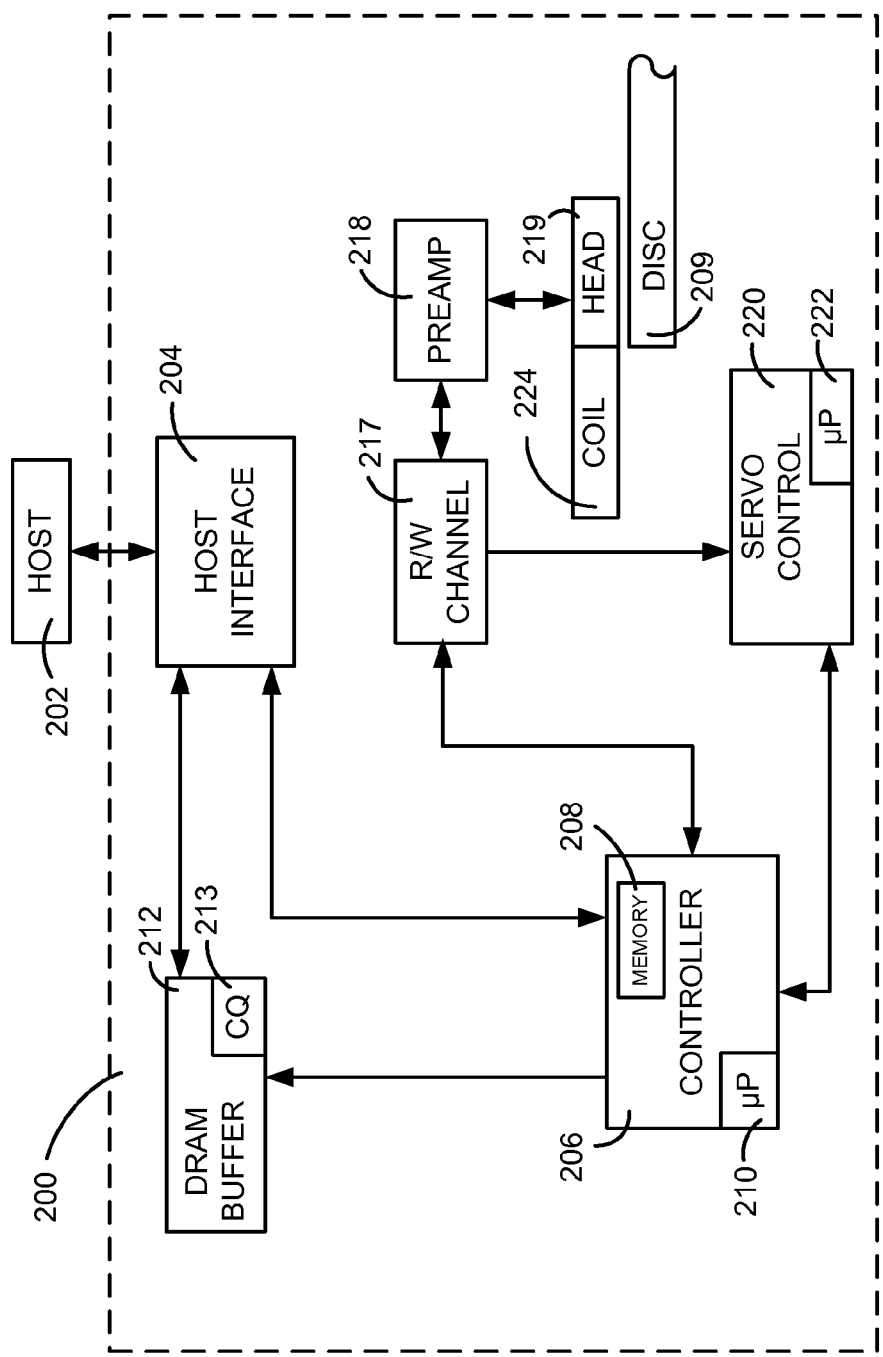
FIG. 2 is a diagram of a data storage device employing Gray code Check bits, in accordance with certain embodiments of the present disclosure.

FIG. 2 depicts a diagram of an illustrative embodiment of a system employing Gray code Check bits, generally designated 200. Specifically, FIG. 2 provides a functional block diagram of a data storage device (DSD). The DSD 200 can be a desktop computer, a laptop computer, a server, a personal digital assistant (PDA), a telephone, a music player, any other device which may be used to store or retrieve data, or any combination thereof. The DSD 200 can optionally connect to and be removable from a host device 202, which can similarly be a desktop computer, a laptop computer, a server, a personal digital assistant (PDA), a telephone, a music player, another electronic device, or any combination thereof. The data storage device 200 can communicate with the host device 202 via a hardware/firmware based host interface circuit 204 that may include a connector (not shown) that allows the DSD 200 to be physically removed from the host 202.

The DSD 200 can include a programmable controller 206 with associated memory 208 and processor 210. A buffer 212 can temporarily store user data during read and write operations and can include a command queue (CQ) 213 where multiple pending access operations can be temporarily stored pending execution. Further, FIG. 2 shows the DSD 200 can include a read/write (R/W) channel 217, which can encode data during write operations and reconstruct user data retrieved from disc(s) 209 during read operations. A preamplifier/driver circuit (preamp) 218 can apply write currents to the head(s) 219 and provides pre-amplification of readback signals. A servo control circuit 220 may use servo data to provide the appropriate current to the coil 224 to position the head(s) 219 over the disc(s) 209. The controller 206 can communicate with a processor 222 to move the head(s) 219 to the desired locations on the disc(s) 209 during execution of various pending commands in the command queue 213.

The controller 206 may detect when a Gray code error occurs on a disc based memory device. As described above, a format of a disc memory device may include tracks having Gray code regions that store encoded servo location information such as track identification or sector identification.

A Gray code error may be detected if the difference between the estimated Gray code value of where the head is expected to be and the Gray code value read by the head 219 is greater than a predefined value. As an equation, a Gray code error may be detected if (Read Gray Code−Estimated Gray Code>Predefined Value). In some embodiments, the difference between a detected position error signal (PES) and an expected PES may be compared against a predefined value. A PES may be generated based on the read Gray code and burst pattern fields of the servo sectors. The predefined value may differ based on whether the DSD was performing a seek operation, a track-following read or write operation, or other operation. For example, the predefined value may be higher during a seek operation where a head is crossing tracks quickly than during a write operation when a head should be following a single track.

If the difference between the estimated and read Gray code values exceeds the predefined value threshold, a Gray code error may have occurred. A DSD 200 may need to determine whether an actual head movement occurred, or whether there was a Gray code detection error. Sensors (not shown) may be used to rule out mechanical causes of a sudden jump in detected head 219 location, such as shocks or bumps to the DSD 200. Other methods of Gray code error detection are also possible.

As track densities and linear densities are increased on data storage mediums to meet target storage capacities, Gray code detection performance may decrease due to degradation in pattern quality. Methods of detecting and correcting Gray code errors are disclosed in pending U.S. patent application Ser. No. 13/427,490—Servo Gray Code Error Correction, which is incorporated by reference herein in its entirety. However, there exists a possibility of a data storage device detecting a Gray code "error" when an actual head movement occurred, and "correcting" the error to continue writing on the current track. If an actual head movement is detected and treated as an error in reading the Gray code, it may result in a DSD writing on the incorrect data track, which may result in losing important data.

The problem of detecting false positives for Gray code errors can be addressed by adding Check bits to Gray code fields of a data storage medium. Check bits may be one or more bits used to improve the accuracy of detecting an unexpected transducer movement using Gray code data. The addition of Gray code Check bits can generally improve error detection and correction, and thereby increase reliability of data storage devices. Check bits allow for more reliable Gray code error correction, such as by using methods disclosed in application Ser. No. 13/427,490. In some embodiments, Check bits may be included in each servo sector of the tracks of a DSD along with the main Gray code field. Check bits may be located anywhere in a servo sector, and may preferably be located after the main Gray code field. For example, the Check bits may be located immediately after the main Gray code field, or they may be located after a burst pattern field which follows the main Gray code field.

Turning now to FIG. 3, a chart illustrating a system for Gray code Check bits is shown and generally designated 300. The chart 300 shows a position error signal (PES) column 302, a main Gray code column 304, a Check bits column 306, and a mini PES column 308. As discussed previously, a PES value may be generated based on the read Gray code value and a burst pattern field of the servo sector. Similarly, the mini PES may be generated based on the read Gray code Check bits and the burst pattern field. Although the PES and mini PES fields are depicted as integer values, the integer values may only be an approximation of the actual PES and mini PES values because on the non-integer nature of the burst pattern fields.

Chart 300 shows a Gray code portion of servo data fields of eight consecutive tracks on a disc data storage medium, numbered 0 to 7 as indicated by the position error signal (PES) numbers 302. The main gray code portion 304 depicts the four least significant bits of the Gray code field of the shown servo sectors. The main gray code column 304 has Gray code counting from 0 to 7, and may continue for tracks not depicted in FIG. 3. The Check bits column 306 shows a 2-bit number for each track. PES may be obtained using the main Gray code field and burst fields of a servo data sector, while mini PES may be obtained using the Check bits and the burst fields. While the main Gray code field 304 and the Check bits field 306 may be included in the servo data fields for each track, in some embodiments the numbers in the PES and mini PES columns may not be recorded to the disc.

Chart 300 contains a Check bits column 306 for the servo fields of each depicted track. In the example embodiment, a 2-bit Check bits field 306 is shown, which may also be encoded using Gray code. In some embodiments, the Check bits may be stored using standard binary numbering. A 2-bit number can be used to count four distinct values, such as 0 to 3 as shown by the Mini PES column 308. Gray code errors occurring in more significant bits may be easier to detect than Gray code errors in the least-significant bits, since errors in the more significant bits may indicate the head is grossly misaligned. The Check bits may provide a small track range of additional head position estimation that helps detect minor head positioning errors, although it may also be used to identify Gray code errors occurring anywhere. This Check bit range (e.g. 2 bits for 4 tracks) may be referred to as a mini sector, mini PES range, Check sector, or Check range. In an illustrative embodiment, the read head may read the main Gray code field to determine head position, and read the Check bits to help determine whether the head is actually over the correct track or if a Gray code read error has occurred.

In an example embodiment, the head may be positioned over the track indicated by PES 0 for a write operation, but due to an error in reading the main Gray code field, the second-to-last bit is read as a 1 instead of a 0. Instead of the expected Gray code ending in 000x, a Gray code value ending in 001x was read. In other words, while the head is positioned over track 0, the read Gray code indicates the head is over track 3. If Check bits are not included, the drive would have to decide whether to correct the Gray code error and continue writing, or stop the write process. If the head is properly positioned and the PES reading of 0010 was an error, continuing the write is not a problem. But if the head actually moved, continuing the write could destroy data on track 3. If the writing process was stopped and the head was not actually misaligned, then drive performance would suffer.

However, in an embodiment with Check bits, the Check bits could be consulted after the anomalous Gray code reading. If the Check bits are 10, the head is likely misaligned and positioned over the track indicated by PES 3 after all—the write should be stopped. If the Check bits are 00, then it is likely the head is properly located over track 0, and that a Gray code detection error occurred and can be corrected. The write in this case may safely continue.

In another example embodiment, the drive may direct the head to track 5, and read the expected Gray code value ending in 0111. Due to an error, the head may actually be located over track 2, and a Gray code detection error results in reading 0111 instead of 0011. Without Check bits, the drive may write to the track incorrectly without realizing an error occurred. However, using the Check bits it may be possible to determine that the head may be misaligned.

FIG. 4 is another chart illustrating a system for Gray code Check bits, generally designated 400. In the embodiment of FIG. 4, a PES column 402, a main Gray code column 404, a Check bits column 406, and a mini PES column 408 are depicted, similar to FIG. 3. Chart 400 depicts 9 tracks, as indicated by PES number 0 through 8. The main Gray code field for each track may be the same length and numbering scheme as in FIG. 3. The Check bits column 406, however, contains three bits in the depicted embodiment. Three bits can be used to count 8 distinct values, as shown by the mini PES column 408, instead of the 4 values counted by FIG. 3's two-bit Check bits column. A greater number of Check bits allows for a larger Check range, which in turn can be used by a data storage device to obtain a better idea of actual head position in case of possible Gray code read errors. In some embodiments, more than three Check bits could be used, or as few as one Check bit.

In some embodiments, the servo burst fields on tracks used for fine positioning can add additional information when determining head positioning. For example, burst patterns may have periods that cover multiple tracks. If a burst pattern has a period of two tracks, for example comprising tracks 0 and 1, the burst pattern may be used to determine head positioning between those two tracks.

Information from burst patterns may be used in conjunction with Check bits to create larger Check ranges. This can be because the burst pattern value and the Check bit value can create a unique combination for a certain range. These ranges may be defined by the lowest common multiple to obtain a whole number between the number of tracks in the period of the burst patterns and the range of values which can be counted by the Check bit fields. For example, a 2-bit Check bit field may be used to count four values, 0 through 3. If the burst pattern period is 2 tracks, the lowest common multiple would be 4 (4 value range*1=4; and 2 track period*2=4). Since the range of a 2-bit Check bits field is already 4, factoring in the burst fields may not create a larger Check range. Similarly, the lowest common multiple of a 3-bit Check bits field (8 value range) and a 2-track burst pattern period may still only be 8.

On the other hand, if the burst patterns had a 3-track period, the Check range may be extended. The lowest common multiple between a 3-track period and a 2-bit Check bits field may be 12 tracks; 4 value range*3=12, and 3-track period*4=12. Similarly, with an 8-value range 3-bit Check bits field, the lowest common multiple may be 24 tracks. By using a burst pattern period that is not divisible into the Check bit value range, the Check range used to pinpoint head positioning can be extended without using additional disc space.

A system employing Check bits may be configured in a number of ways, depending on whether greater data integrity is desired (e.g. stopping more writes when a positioning error may have occurred), or whether superior performance is desired (e.g. completing more writes on a first attempt, even when a positioning error may have occurred). In some embodiments, the behavior of the DSD may be configured by the manufacturer, by the user, by a host, or by any combination thereof.

Figure 5:
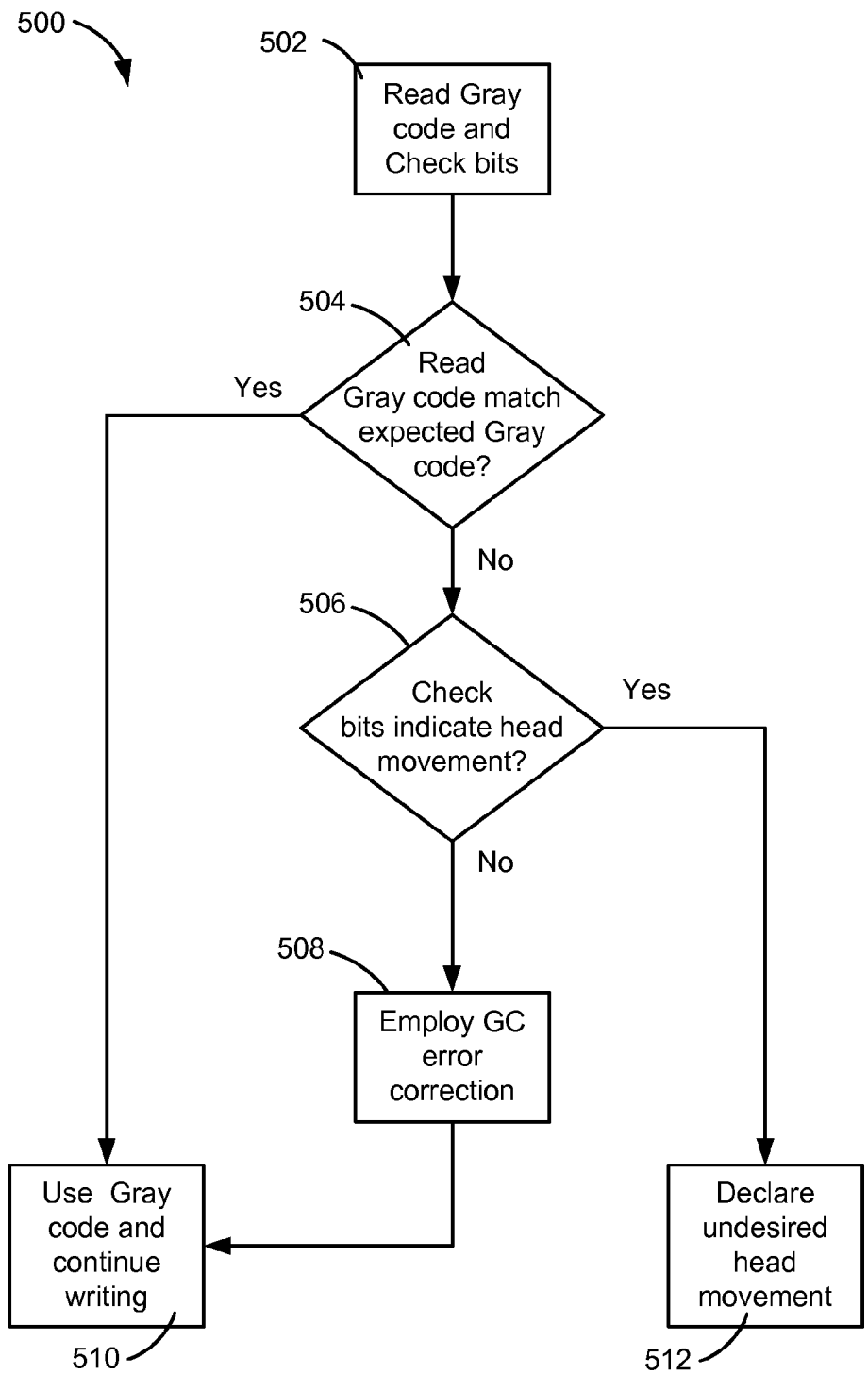
FIG. 5 is a flowchart of a method employing Gray code Check bits, in accordance with certain embodiments of the present disclosure.

FIG. 5 depicts a flowchart of an illustrative embodiment of a method employing Gray code Check bits, generally designated 500. According to this method, it may be assumed that the only time a real head movement occurred is when both the main Gray code and the Check bits indicate movement.

In the depicted method 500, the main Gray code bits and the Check bits may be read, at 502. The method 500 may next involve determining whether the read main Gray code matches the expected Gray code of the target track, at 504. As discussed previously, in some embodiments a detected PES value, which is based on the read man Gray code, may be compared against an expected PES value.

If the read Gray code does match, the embodiment of method 500 may involve using the read Gray code and continuing the write operation without consulting the Check bits, at 510. In some embodiments, the read Gray code or detected PES does not need to exactly match the expected values, due to the head potentially reading part of the Gray code field from one track and the rest from another track during a seek operation. For example, a given bit of the Gray code field may be ignored if that bit was likely to change during a seek operation.

If the read Gray code does not match the expected Gray code, at 504, the method 500 may involve determining whether the Check bits indicate a head movement, at 506. As described above, this may involve checking whether the Check bits match the expected Check bits for the target track. A match suggests no head movement, while not detecting a match indicates that the head is not positioned over the proper track. If head movement is suggested at 506, the method 500 may involve declaring an undesired head movement, at 512. This may involve stopping a read or write operation. If both the read Gray code and the Check bits indicate movement, the read Gray code value may be assumed to be true and used to reposition the head.

Of the Check bits do not indicate head movement at 506, the method may employ Gray code correction methods at 508 to attempt to correct the error that caused the mismatch at 504, such as correction methods disclosed in application Ser. No. 13/427,490. After employing Gray code error correction methods, the corrected Gray code may be used and write commands may be executed on the current track, at 510. In some embodiments, Gray code correction techniques may not be required. For example, if the Check bits indicate no head movement, the expected Gray code value can be used instead of correcting the read Gray code, and may be combined with read burst pattern information to generate a PES. In some embodiments, substituting the expected Gray code for the read Gray code may be considered a Gray code error correction technique.

Figure 6:
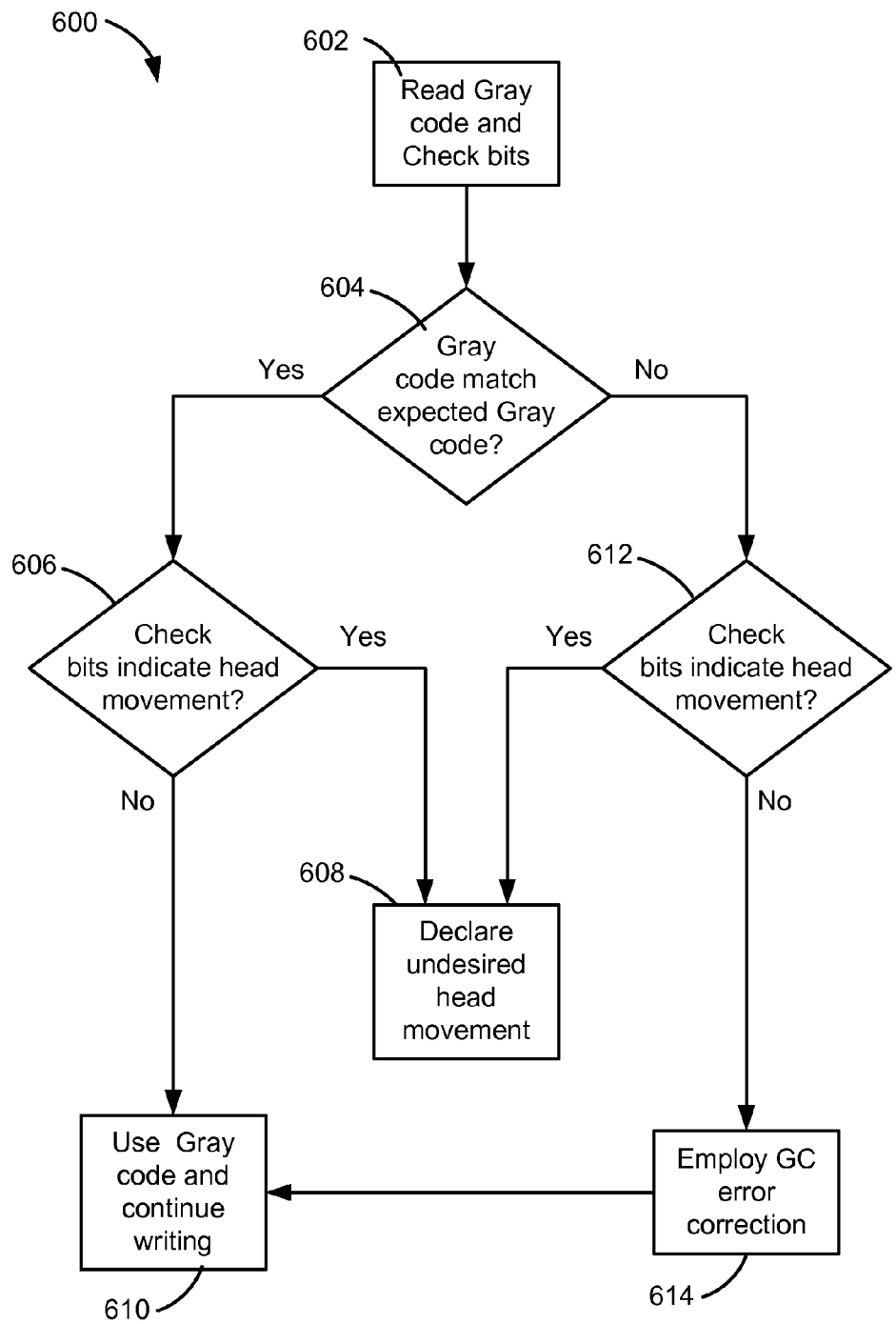
FIG. 6 is a flowchart of a method employing Gray code Check bits, in accordance with certain embodiments of the present disclosure.

Turning now to FIG. 6, a flowchart of an illustrative embodiment of another method employing Gray code Check bits is shown and generally designated 600. According to this method, it may be assumed that the only time a real head movement occurred is when the Check bits indicate head movement.

Gray code and Check bits may be read at 602. A determination may then be made whether the main Gray code field matches the expected Gray code of the target track, at 604. Unlike in the method of FIG. 5, Check bits may be checked every time in method 600. If the read Gray code field does match the expected Gray code value, the Check bits may be checked to see if they indicate head movement, at 606. If no head movement is indicated, the read Gray code values may be used and a write command may proceed, at 610. If the Check bits do indicate head movement at 606, the method 600 may involve declaring an undesired head movement, at 608. As with FIG. 5, declaring an undesired head movement may involve stopping a read or write operation.

If the read Gray code field did not match the expected Gray code value, at 604, the method 600 involve consulting the Check bits, at 612. If the Check bits do indicate a head movement, the method 600 may involve declaring an undesired head movement fault, at 608. If both the read Gray code and the Check bits indicate movement, the read Gray code value may be assumed to be true and used to reposition the head.

If the Check bits indicate no head movement, at 612, Gray code error correction may be applied to the read Gray code, at 614. If successfully corrected, the method 600 may involve using the corrected Gray code value and writing data to the track, at 610. As with FIG. 5, in some embodiments, Gray code correction techniques may not be used. For example, if the Check bits indicate no head movement, the expected Gray code value can be used instead of correcting the read Gray code, and may be combined with read burst pattern information to generate a PES.

Figure 7:
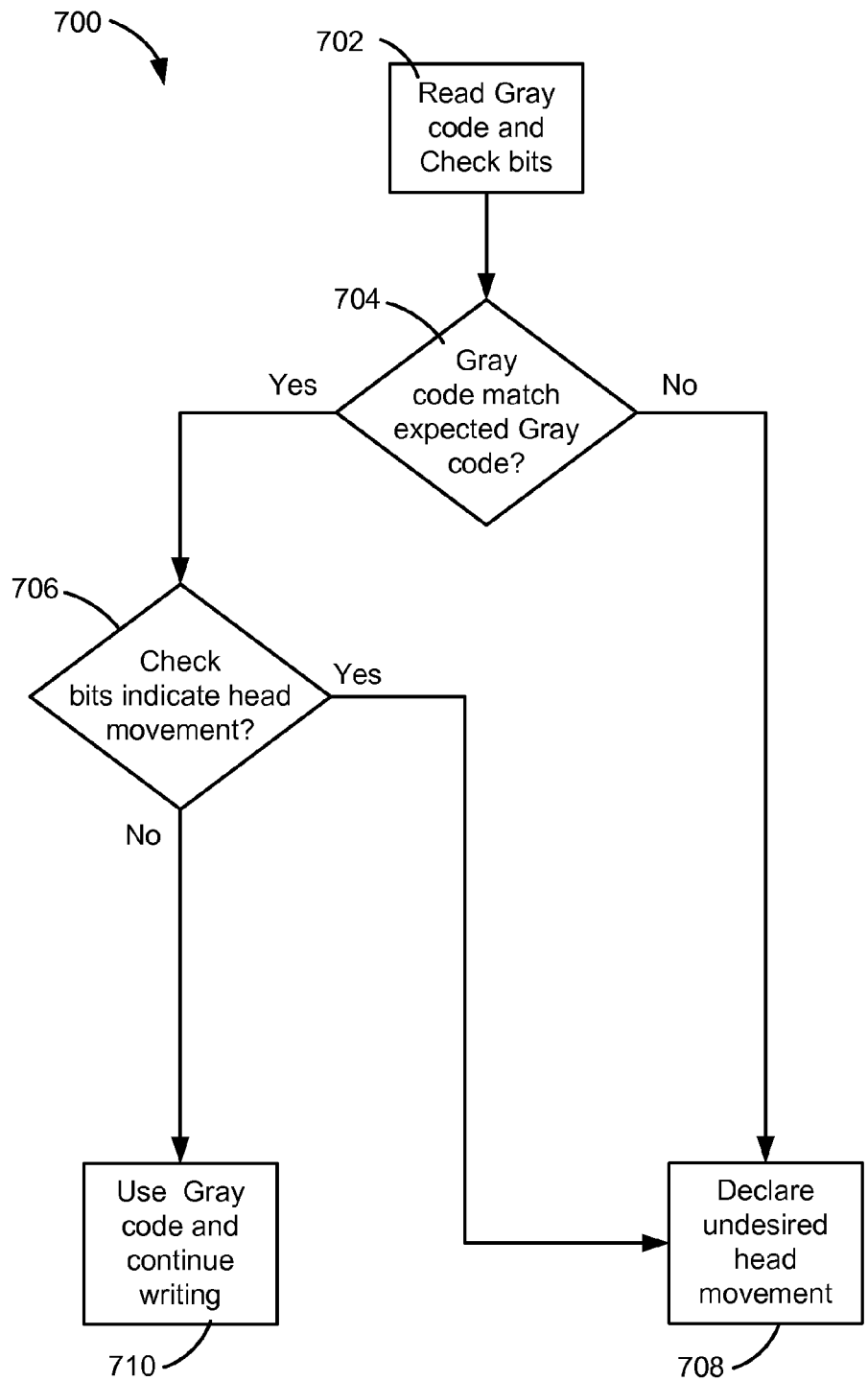
FIG. 7 is another flowchart of a method employing Gray code Check bits, in accordance with certain embodiments of the present disclosure.

FIG. 7 is a flowchart of an illustrative embodiment of another method employing Gray code Check bits, generally designated 700. According to this method 700, it may be assumed that the only time real head movement has occurred is if either Gray code or Check bits indicate movement. This method may result in the most aborted writes, and may end up not employing Gray code error correction, but is also may be the least likely to overwrite an incorrect data track.

Main Gray code and Check bits may be read, at 702. The read Gray code may be compared against the expected Gray code, at 704. If the read Gray code does not match the expected Gray code, the Gray code may not be used, and the track may not be written, at 708. If the read Gray code does match the expected Gray code, at 704, it may be determined whether the Check bits indicate head movement, at 706. If the Check bits do indicate head movement, an undesired head movement may be declared, at 708. If the Check bits do not indicate head movement, at 706, the read Gray code value may be used and data may be written to the current track, at 710.

While three methods of employing Check bits for Gray code are illustrated in FIGS. 5-7, other methods and combinations are possible. Methods may also consider input from other sensors, such as shock or movement sensors, when determining whether a Gray code error has occurred or whether to use a read Gray code value. For example, after detecting a Gray code error, a data storage device may check whether any vibrations or shocks occurred before checking Check bits. If a shock or vibration did occur, it may assume that the head moved and not attempt to correct the Gray code or write to the current track.

In some embodiments, the methods may be performed by controllers or processors within a data storage device or host device. The methods may be performed by a computer readable data storage device storing instructions that, when executed by a processor, cause the processor to perform the methods.

The inclusion of Check bits can greatly reduce the incidence of Gray code errors not being detected, as well as the incidence of miscorrecting actual head movements and writing over the incorrect track. In the depicted embodiments, the Check bits follow the Gray code field, but the Check bits could be located in other locations, such as before the Gray code field or at the end of the servo data field.

In accordance with various embodiments, the methods described herein may be implemented as one or more software programs running on a computer processor or controller device. In accordance with another embodiment, the methods described herein may be implemented as one or more software programs running on a computing device, such as a personal computer that is using a data storage device such as a disc drive. Dedicated hardware implementations including, but not limited to, application specific integrated circuits, programmable logic arrays, and other hardware devices can likewise be constructed to implement the methods described herein. Further, the methods described herein may be implemented as a computer readable storage medium or device storing instructions that when executed cause a processor to perform the methods.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A device comprising:
   a circuit configured to:
   read servo data that is encoded using a Gray code encoding scheme to produce servo Gray code;
   read one or more Check bits associated with the servo Gray code, the one or more Check bits define a Check range of a plurality of data tracks, each track in the plurality of data tracks containing a unique Check bit value within the Check range;
   determine whether a transducer is positioned over a target data track based on the servo Gray code and the one or more Check bits; and
   manipulate the transducer based on whether the transducer is positioned over the target data track.

2. The device of claim 1 further comprising:
   a number of tracks in the Check range is defined by a lowest common multiple between a period of a burst pattern and a range of values which can be counted by the one or more Check bits, each track in the Check range containing a unique combination of Check bit value and burst pattern value.

3. The device of claim 1 further comprising the one or more Check bits are encoded using the Gray code encoding scheme.

4. The device of claim 1 comprising the circuit further configured to:
   determine whether the servo Gray code matches an expected Gray code;
   when the servo Gray code matches the expected Gray code, manipulate the transducer based on the servo Gray code; and
   when the servo Gray code does not match the expected Gray code, determine whether the one or more Check bits match an expected value of the one or more Check bits.

5. The device of claim 4 comprising the circuit further configured to:
   when the one or more Check bits match the expected value:
     execute a Gray code error correction technique on the servo Gray code to produce corrected servo Gray code;
     manipulate the transducer based on the corrected servo Gray code; and
   declare an undesired transducer movement when the one or more Check bits does not match the expected value.

6. The device of claim 4 comprising the circuit further configured to:
   when the one or more Check bits match the expected value:
     manipulate the transducer based on the expected Gray code; and
   declare an undesired transducer movement when the one or more Check bits does not match the expected value.

7. The device of claim 1 comprising the circuit further configured to:
   determine whether the servo Gray code matches an expected Gray code;
   determine whether the one or more Check bits match an expected value of the one or more Check bits; and
   when the servo Gray code matches the expected Gray code and the one or more Check bits match the expected value, manipulate the transducer based on the servo Gray code.

8. The device of claim 7 comprising the circuit further configured to:
   when the servo Gray code does not match the expected Gray code and the one or more Check bits match the expected value:
     execute a Gray code error correction technique on the servo Gray code to produce corrected servo Gray code;
     manipulate the transducer based on the corrected servo Gray code; and
   declare an undesired transducer movement when the one or more Check bits does not match the expected value.

9. The device of claim 7 comprising the circuit further configured to:
   when the servo Gray code does not match the expected Gray code and the one or more Check bits match the expected value:
     manipulate the transducer based on the expected Gray code; and
   declare an undesired transducer movement when the one or more Check bits does not match the expected value.

10. The device of claim 1 comprising the circuit further configured to:
    determine whether the servo Gray code matches an expected Gray code;
    when the servo Gray code does not match the expected Gray code, declare an undesired transducer movement; and
    when the servo Gray code matches the expected Gray code, determine whether the one or more Check bits match an expected value of the one or more Check bits.

11. The device of claim 10 comprising the circuit further configured to:
    when the one or more Check bits match the expected value, manipulate the transducer based on the servo Gray code; and
    declare an undesired transducer movement when the one or more Check bits does not match the expected value.

12. The device of claim 1 comprising the circuit further configured to:
    manipulate the transducer by stopping a write operation when the transducer is not positioned over the target data track.

13. The device of claim 1 further comprising:
    determine whether the transducer is positioned over the target data track includes:
      determine a Gray code error when a difference between the read servo Gray code and an expected Gray code value is greater than a predefined value; and determine, based on the one or more Check bits, whether the Gray code error.

14. The device of claim 1 comprising the circuit further configured to:
determine whether the transducer is positioned over the target data track includes:
   generate a position error signal (PES) value based on the servo Gray code and burst patterns recorded to the target data track;
   generate a mini PES value based on the one or more Check bits and the burst patterns; and
   determine a transducer position based on the PES value and the mini PES value.

15. A method comprising:
manipulating a transducer based on servo Gray code and one or more Check bits that indicate whether the transducer is positioned over a target data track, the one or more Check bits define a Check range of a plurality of data tracks, each track in the plurality of data tracks containing a unique Check bit value within the Check range.

16. The method of claim 15 further comprising:
determining whether the servo Gray code matches an expected Gray code;
when the servo Gray code matches the expected Gray code, manipulating the transducer based on the servo Gray code;
when the servo Gray code does not match the expected Gray code, determining whether the one or more Check bits match an expected value of the one or more Check bits;
when the one or more Check bits match the expected value:
   executing a Gray code error correction technique on the servo Gray code to produce corrected servo Gray code;
   manipulating the transducer based on the corrected servo Gray code; and
declaring an undesired transducer movement when the one or more Check bits does not match the expected value.

17. The method of claim 15 further comprising:
determining whether the servo Gray code matches an expected Gray code;
determining whether the one or more Check bits match an expected value of the one or more Check bits;
when the servo Gray code matches the expected Gray code and the one or more Check bits match the expected value, manipulating the transducer based on the servo Gray code
when the servo Gray code does not match the expected Gray code and the one or more Check bits match the expected value:
   executing a Gray code error correction technique on the servo Gray code to produce corrected servo Gray code;
   manipulating the transducer based on the corrected servo Gray code; and
declaring an undesired transducer movement when the one or more Check bits does not match the expected value.

18. The method of claim 15 further comprising:
determining whether the servo Gray code matches an expected Gray code;
when the servo Gray code matches the expected Gray code, determining whether the one or more Check bits match an expected value of the one or more Check bits;
when the one or more Check bits match the expected value, manipulating the transducer based on the servo Gray code; and
declaring an undesired transducer movement when the servo Gray code does not match the expected Gray code or when the one or more Check bits does not match the expected value.

19. A device comprising:
a disc with tracks including servo data;
a transducer;
a controller configured to:
   read servo data that is encoded using a Gray code encoding scheme to produce servo Gray code;
   read one or more Check bits associated with the servo Gray code, the one or more Check bits defining a Check range of a plurality of tracks, each track in the plurality of tracks containing a unique Check bit value within the Check range;
   determine whether the transducer is positioned over a target data track in response to the servo Gray code and the one or more Check bits; and
   manipulate the transducer in response to whether the transducer is positioned over the target data track.

20. The device of claim 19 comprising the controller further configured to:
determine whether the servo Gray code matches an expected Gray code;
when the servo Gray code matches the expected Gray code, manipulate the transducer in response to the servo Gray code;
when the servo Gray code does not match the expected Gray code, determine whether the one or more Check bits match an expected value of the one or more Check bits;
when the one or more Check bits match the expected value:
   execute a Gray code error correction technique on the servo Gray code to produce corrected servo Gray code;
   manipulate the transducer in response to the corrected servo Gray code; and
declare an undesired transducer movement when the one or more Check bits does not match the expected value.

21. The device of claim 19 comprising the controller further configured to:
determine whether the servo Gray code matches an expected Gray code;
determine whether the one or more Check bits match an expected value of the one or more Check bits;
when the servo Gray code matches the expected Gray code and the one or more Check bits match the expected value, manipulate the transducer in response to the servo Gray code;
when the servo Gray code does not match the expected Gray code and the one or more Check bits match the expected value:
   execute a Gray code error correction technique on the servo Gray code to produce corrected servo Gray code;
   manipulate the transducer in response to the corrected servo Gray code; and
declare an undesired transducer movement when the one or more Check bits does not match the expected value.

22. The device of claim 19 comprising the controller further configured to:
determine whether the servo Gray code matches an expected Gray code;
when the servo Gray code matches the expected Gray code, determine whether the one or more Check bits match an expected value of the one or more Check bits;

when the one or more Check bits match the expected value, manipulate the transducer in response to the servo Gray code; and declare an undesired transducer movement when the servo Gray code does not match the expected Gray code or when the one or more Check bits does not match the expected value.

23. The device of claim 19 further comprising: the one or more Check bits are located after the servo Gray code in servo data fields of the plurality of tracks.

* * * * *